(12) United States Patent
Kim et al.

(10) Patent No.: US 10,606,695 B2
(45) Date of Patent: Mar. 31, 2020

(54) ERROR CORRECTION CIRCUIT AND MEMORY SYSTEM INCLUDING THE SAME

(71) Applicant: SK hynix Inc., Gyeonggi-do (KR)

(72) Inventors: Dae Sung Kim, Gyeonggi-do (KR); Kwang Hyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/199,581

(22) Filed: Nov. 26, 2018

(65) Prior Publication Data

US 2019/0324849 A1 Oct. 24, 2019

(30) Foreign Application Priority Data

Apr. 18, 2018 (KR) .......................... 10-2018-0045210

(51) Int. Cl.
*H03M 13/00* (2006.01)
*G06F 11/10* (2006.01)
*G11C 11/56* (2006.01)
*H03M 13/11* (2006.01)
*G11C 16/26* (2006.01)
*G11C 16/10* (2006.01)

(52) U.S. Cl.
CPC ...... *G06F 11/1048* (2013.01); *G11C 11/5642* (2013.01); *G11C 16/10* (2013.01); *G11C 16/26* (2013.01); *H03M 13/1108* (2013.01)

(58) Field of Classification Search
CPC . G06F 11/1048; G11C 11/5642; G11C 16/10; G11C 16/26; H03M 13/1108

USPC .......................... 714/758, 751, 752, 800, 804
See application file for complete search history.

(56) References Cited

U.S. PATENT DOCUMENTS

| | | | |
|---|---|---|---|
| 8,234,555 B2 * | 7/2012 | Yokokawa | H03M 13/1111 714/786 |
| 2017/0272097 A1 * | 9/2017 | Weng | H03M 13/1108 |
| 2018/0358983 A1 * | 12/2018 | Kim | H03M 13/1108 |
| 2019/0312593 A1 * | 10/2019 | Hsiao | G11C 29/52 |

FOREIGN PATENT DOCUMENTS

| | | |
|---|---|---|
| KR | 101482684 | 1/2015 |
| KR | 1020160113001 | 9/2016 |

* cited by examiner

*Primary Examiner* — Christine T. Tu
(74) *Attorney, Agent, or Firm* — IP & T Group LLP

(57) ABSTRACT

An error correction circuit includes a decoder including a plurality of check node units and variable node units corresponding to a parity check matrix of low density parity check (LDPC) scheme, and configured to generate decoded data by decoding a codeword; a syndrome check circuit configured to calculate a reference value for the codeword based on the parity check matrix, and generate a decoder operation control signal corresponding to the reference value; and a control circuit configured to control whether to operate each of the plurality of check node units and variable node units of the decoder in response to the decoder operation control signal, wherein the decoder decodes the codeword based on check node units and variable node units which operate according to the control of the control circuit among the plurality of check node units and variable node units.

20 Claims, 11 Drawing Sheets

☐ : Check node unit
○ : Variable node unit

Calculate the number of non-zero elements as reference value

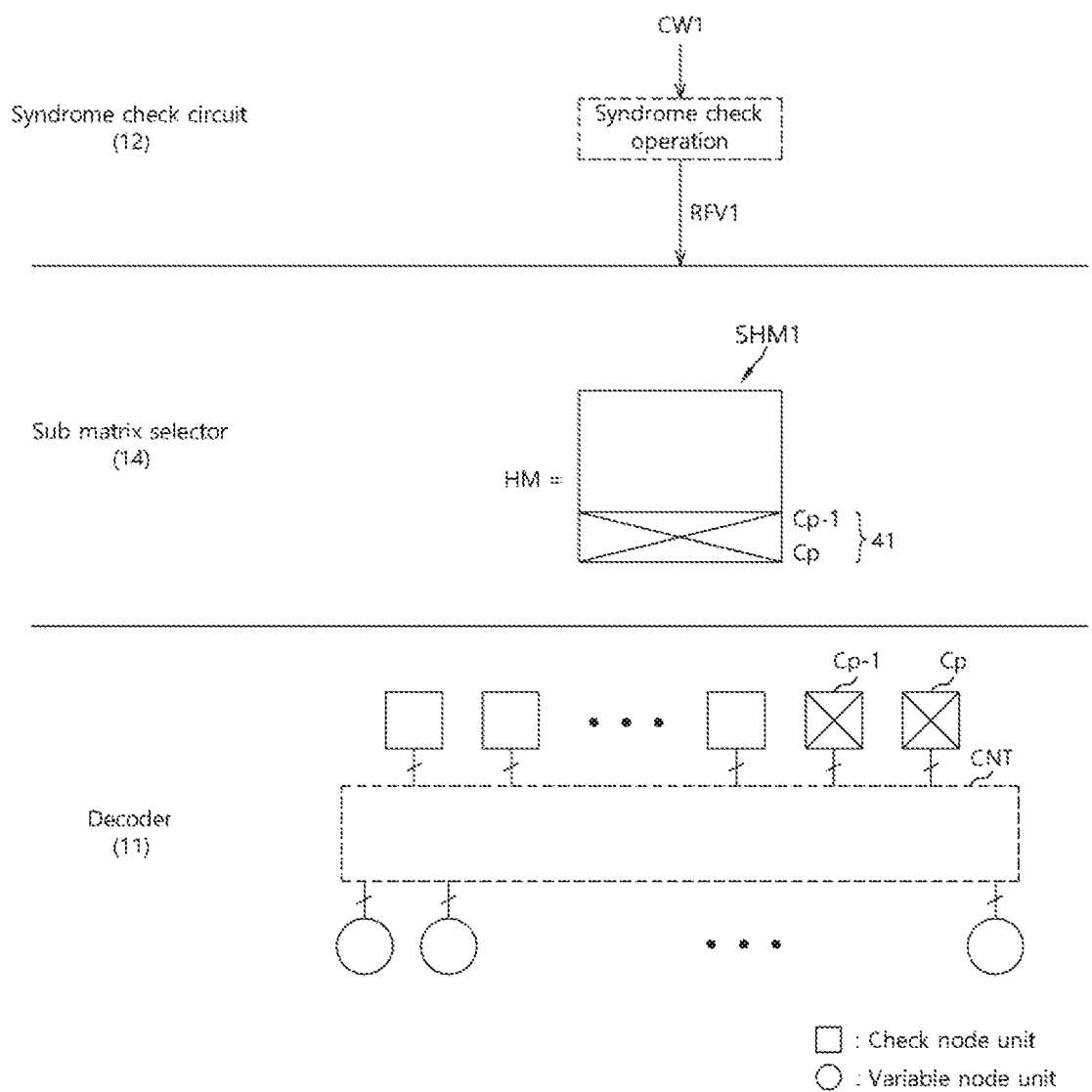

Sub matrix selector
(14)

Decoder
(11)

☐ : Check node unit
○ : Variable node unit

ERROR CORRECTION CIRCUIT AND MEMORY SYSTEM INCLUDING THE SAME

CROSS-REFERENCE TO RELATED APPLICATION

The present application claims priority under 35 U.S.C. § 119(a) to Korean application number 10-2018-0045210, filed on Apr. 18, 2018, the entire disclosure of which is incorporated herein by reference in its entirety.

BACKGROUND

1. Technical Field

Various embodiments of the present invention generally relate to an error correction circuit. Particularly, the embodiments relate to an error correction circuit which operates based on a low density parity check (LDPC) code.

2. Related Art

The LDPC code may be characterized as an error correction code in which the corresponding parity check matrix includes mostly 0s and a small number of non-zero values (e.g., 1s). The LDPC code may be used not only to correct an error in signals transmitted among wired/wireless communication systems but also to correct an error in data read out from a memory system.

A memory system may be configured to store data provided from a host device, in response to a write request received from the host device. Also, the memory system may be configured to provide stored data to the host device, in response to a read request received from the host device. The host device may be an electronic device capable of processing data and may include a computer, a digital camera or a mobile phone. The memory system may operate by being built in the host device, or may operate by being manufactured in a separable form and being coupled to the host device.

SUMMARY

In an embodiment, an error correction circuit may include: a decoder including a plurality of check node units and variable node units corresponding to a parity check matrix of low density parity check (LDPC) scheme, and configured to generate decoded data by decoding a codeword; a syndrome check circuit configured to calculate a reference value for the codeword based on the parity check matrix, and generate a decoder operation control signal corresponding to the reference value; and a control circuit configured to control whether to operate each of the plurality of check node units and variable node units of the decoder in response to the decoder operation control signal, wherein the decoder decodes the codeword based on check node units and variable node units which operate according to the control of the control circuit among the plurality of check node units and variable node units.

In an embodiment, a memory system may include: a memory device including a memory region which stores a codeword, and configured to read the codeword from the memory region and output the codeword to a channel; and an error correction circuit configured to perform an error correction operation for the codeword transmitted through the channel, wherein the error correction circuit comprises: a decoder including a plurality of check node units and a plurality of variable node units corresponding to a parity check matrix of low density parity check (LDPC) scheme; and a power controller configured to cut off power supply to one or more first check node units among the check node units depending on a power control information, wherein the decoder performs a decoding operation for the codeword by using variable node units and check node units to which power is supplied.

In an embodiment, an error correction circuit may include: a storage configured to store in advance information representing one or more combinations of to-be-powered-off check node units, wherein the combinations respectively correspond to reference numbers of non-zeros; a decoder configured to perform a low density parity check (LDPC)-based decoding operation to a codeword iteratively a predetermined number of times until the decoding operation is successful and configured to output, when the decoding operation of a current iteration fails, information of a number of non-zeros as a result of a syndrome check at the current iteration, wherein the decoding operation is performed by powered-on check node units and variable node units among the plurality of check node units and variable node units at each iteration; a selector configured to select one among the combinations according to the number of non-zeros; and a power controller configured to cut off power supply to the selected combination for the decoding operation of a subsequent iteration, wherein the decoding operation is performed on a basis of a parity check matrix of a scheme of the LDPC, and rows and columns of the parity check matrix correspond to the check node units and variable node units.

BRIEF DESCRIPTION OF THE DRAWINGS

FIGS. 4A and 4B are diagrams describing a method for controlling power supply to check node units depending on a reference value in accordance with an embodiment.

DETAILED DESCRIPTION

Figure 1:
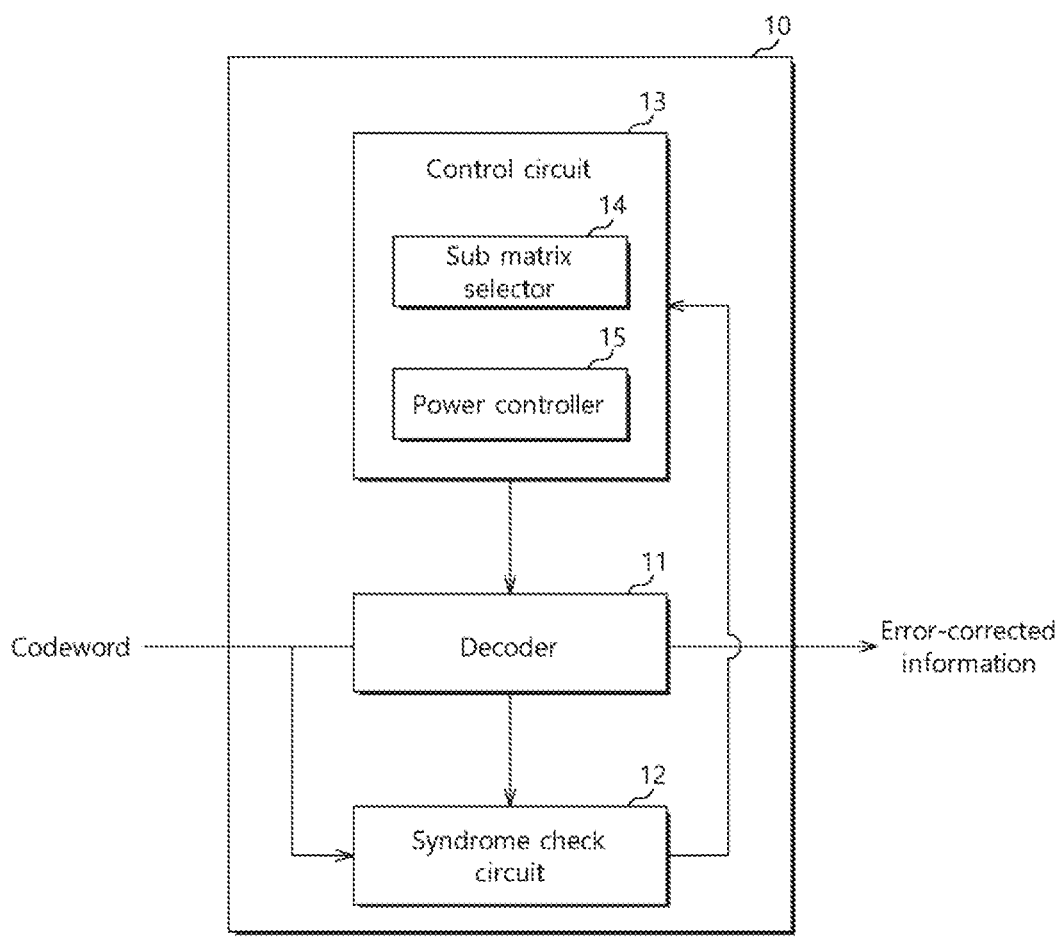
FIG. 1 is a block diagram illustrating an error correction circuit in accordance with an embodiment.

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is noted that reference to "an embodiment" does not necessarily mean only one embodiment, and different references to "an embodiment" are not necessarily to the same embodiment(s).

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, singular forms are intended to include the plural forms as well and vice versa, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating an error correction circuit 10 in accordance with an embodiment.

The error correction circuit 10 may include a decoder 11, a syndrome check circuit 12, and a control circuit 13. The decoder 11 may include include a parity check matrix (described in more detail with reference to FIG. 2) of low density parity check (LDPC) scheme and a plurality of check node units and variable node units corresponding to the parity check matrix, and may be configured to generate decoded data by decoding a codeword. The syndrome check circuit 12 may be configured to calculate a reference value for the codeword, based on the parity check matrix, and generate a decoder operation control signal corresponding to the reference value. The control circuit 13 may be configured to control whether to operate each of the plurality of check node units and variable node units of the decoder 11, in response to the decoder operation control signal. The decoder 11 may decode the codeword by check node units and variable node units which operate according to the control of the control circuit 13 among the plurality of check node units and variable node units.

According to an embodiment, the control circuit 13 may control whether to operate the plurality of check node units and variable node units, such that the number of check node units which operate is proportional to the reference value.

According to an embodiment, the syndrome check circuit 12 may calculate a syndrome matrix by multiplying the parity check matrix and a column matrix of the codeword, and may calculate the reference value in correspondence to the number of non-zero elements in the syndrome matrix.

According to an embodiment, the control circuit 13 may control all the plurality of variable node units and check node units to operate, when the reference value exceeds a threshold value.

According to an embodiment, the syndrome check circuit 12 may calculate a current reference value for a decoding result of the decoding of the codeword based on the parity check matrix.

According to an embodiment, the decoder 11 may generate the decoded data by re-decoding the decoding result in correspondence to the current reference value.

According to an embodiment, in the re-decoding, the control circuit 13 may cut off power supply to one or more check node units among the plurality of check node units, in correspondence to the current reference value.

According to an embodiment, the syndrome check circuit 12 may generate, in correspondence to the current reference value, the decoder operation control signal to operate only some of the check node units among the plurality of check node units, such that the decoder 11 uses a parity check sub-matrix, which is the parity check matrix with one or more rows removed.

According to an embodiment, the control circuit 13 may control operations of the plurality of check node units such that parity check sub-matrixes are sequentially used, in order to decrease a current reference value at each re-decoding.

According to an embodiment, the control circuit 13 may control operations of the plurality of check node units such that the numbers of rows of the parity check sub-matrixes which are sequentially used have an ascending order in the use sequence.

According to an embodiment, the control circuit 13 may control operations of the plurality of check node units such that the parity check sub-matrixes which are sequentially used include the same number of rows.

According to an embodiment, the parity check matrix may include a plurality of row groups, each of which includes rows of one or more circulant permutation matrixes, and the syndrome check circuit 12 may generate the decoder operation control signal such that a parity check sub-matrix, which is obtained when at least one row group is removed from the row groups of the parity check matrix, is used.

According to an embodiment, when rows of the parity check matrix respectively correspond to the plurality of check node units and columns of the parity check matrix respectively correspond to the plurality of variable node units, the control circuit 13 may control, depending on the reference value, whether to operate check node units corresponding to rows and variable node units corresponding to columns configuring a parity check sub-matrix, which may be obtained when one or more columns are additionally removed from a sub-matrix. The sub-matrix may be obtained when one or more rows are removed from the parity check matrix.

According to an embodiment, the one or more columns which are additionally removed from the sub-matrix to configure the parity check sub-matrix may be configured by 0s.

According to an embodiment, the one or more columns which are additionally removed from the sub-matrix to configure the parity check sub-matrix may be of a parity matrix between an information matrix and the parity matrix configuring the parity check matrix.

In detail, referring to FIG. 1, the error correction circuit 10 may receive a codeword, perform an error correction operation for the codeword, and output an error-corrected information, that is, decoded data. The codeword may include data necessary to perform the error correction operation, for example, parity data, and an original information such as user data. Therefore, the error correction circuit 10 may perform the error correction operation for the original information included in the codeword, based on the parity data included in the codeword, and output the error-corrected information.

As described above, the error correction circuit 10 may include the decoder 11, the syndrome check circuit 12 and the control circuit 13.

The decoder 11 may decode a codeword based on the parity check matrix of an LDPC code. As will be described later in detail through FIG. 3, the decoder 11 may include a plurality of check node units and a plurality of variable node units corresponding to the parity check matrix. The check node units may be configured to respectively correspond to the rows of the parity check matrix, and the variable node units may be configured to respectively correspond to the columns of the parity check matrix.

The decoder 11 may perform the decoding operation for the codeword, depending on the reference value of the codeword calculated by the syndrome check circuit 12. The decoder 11 may repeat, depending on the reference value of a decoding result, that is, the result of a current decoding operation, a decoding operation for the result of the current decoding operation. The result of a decoding operation may be an updated/corrected codeword as the decoding operation is performed for an original codeword. When it is determined through the reference value that an updated/corrected codeword or the result of a decoding operation does not include an error, the decoder 11 may not perform a decoding operation any more and an error correction operation may be ended.

The syndrome check circuit 12 may calculate a reference value for a codeword, based on a parity check matrix applied to the decoder 11. The reference value may represent the error rate of the codeword. As will be described later in detail with reference to FIG. 3, a reference value may be substantially proportional to the error rate of a codeword. The syndrome check circuit 12 may calculate a reference value for the result of a decoding operation, each time the decoding operation of the decoder 11 is performed. Therefore, a reference value may mean whether a codeword or the result of a decoding operation includes an error. The syndrome check circuit 12 may transmit a reference value to the control circuit 13 or may generate a decoder operation control signal corresponding to a reference value and transmit the decoder operation control signal to the control circuit 13. While it is described below that the control circuit 13 receives a reference value from the syndrome check circuit 12 and refers to the reference value, it is to be noted that, according to an embodiment, the control circuit 13 may receive a decoder operation control signal corresponding to a reference value, from the syndrome check circuit 12, and refer to the decoder operation control signal.

The control circuit 13 may control the performance of the decoder 11, based on the reference value calculated by the syndrome check circuit 12. In detail, in order to reduce a power consumption of the error correction circuit 10, the control circuit 13 may control, based on the reference value, the decoder 11 not to perform some of originally scheduled decoding calculations.

The control circuit 13 may include a sub-matrix selector 14 and a power controller 15.

The sub-matrix selector 14 may select a parity check sub-matrix from a parity check matrix applied to the decoder 11, depending on the reference value calculated by the syndrome check circuit 12, and may control the power controller 15 to determine whether the check node units need to be turned off, based on the parity check sub-matrix.

In detail, the sub-matrix selector 14 may select, depending on a reference value calculated by the syndrome check circuit 12, a parity check sub-matrix which may be obtained when one or more rows are removed from a parity check matrix applied to the decoder 11. The power controller 15 may supply power only to check node units corresponding to the rows configuring the parity check sub-matrix and all variable node units. Detailed description for this will be made later with reference to FIGS. 4A and 4B.

According to an embodiment, the sub-matrix selector 14 may select, depending on a reference value, a sub-matrix sequence configured by a plurality of parity check sub-matrixes, and sequentially select the parity check sub-matrixes of the sub-matrix sequence each time the decoding operation of the decoder 11 for a codeword is repeated. Detailed description for this will be made later with reference to FIG. 5.

According to an embodiment, the sub-matrix selector 14 may select, depending on a reference value, a parity check sub-matrix which is obtained as one or more columns are additionally removed in a sub-matrix which may be obtained when one or more rows are removed from a parity check matrix. The power controller 15 may supply power only to check node units corresponding to the rows configuring the selected parity check sub-matrix and variable node units corresponding to the columns configuring the selected parity check sub-matrix. Detailed description for this will be made later with reference to FIG. 7.

The power controller 15 may cut off, depending on a reference value, power supply to one or more check node units among the check node units included in the parity check matrix of the decoder 11. Consequently, the check node units to which power supply is cut off may not perform decoding calculations allocated to them.

The present embodiment may be applied to an error correction circuit which operates based on an error correction code (ECC) associated with LDPC. For example, the ECC associated with LDPC may include an LDPC concatenated code and a non-binary LDPC code.

Also, the present embodiment may be applied to an error correction circuit which operates based on all decoding algorithms. By way of example and not limitation, the decoding algorithms may include bit-flipping, symbol flipping, majority logic, sum-product, min-sum and min-max algorithms.

Figure 2:
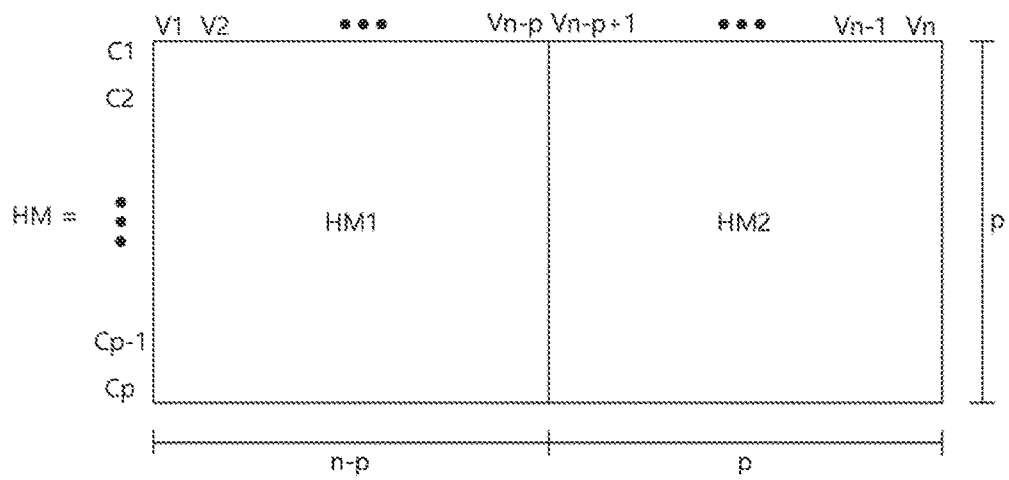
FIG. 2 is a diagram schematically illustrating a structure of a parity check matrix shown FIG. 1 and the structure of a decoder to which the parity check matrix is applied.
Figure 2:
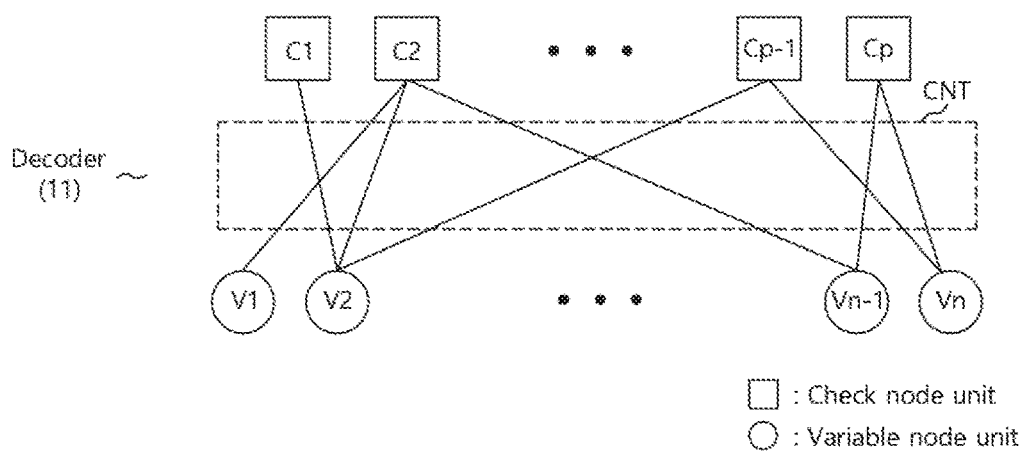

FIG. 2 is a diagram schematically illustrating a structure of a parity check matrix HM and a structure of the decoder 11 shown in FIG. 1 to which the parity check matrix HM is applied.

Referring to FIG. 2, the parity check matrix HM may be configured by p number of rows and n number of columns. The parity check matrix HM may mean linear constraint of n number of bits of a codeword. The parity check matrix HM may be configured to include mostly 0s and some non-zero values (e.g., 1s).

The p number of rows may respectively correspond to p number of check node units C1 to Cp of the decoder 11 of FIG. 1. The n number of columns may respectively correspond to n number of variable node units V1 to Vn of the decoder 11.

The parity check matrix HM may be divided into a p×(n−p) information matrix HM1 and a p×p parity matrix HM2. The information matrix HM1 may indicate which check node units calculate the information bits included in the codeword among the check node units C1 to Cp. The parity matrix HM2 may indicate which variable node units calculate the parity bits included in the codeword among the variable node units V1 to Vn.

The structure of the decoder 11 to which the parity check matrix HM is applied may be shown in the form of a bipartite graph in which the check node units C1 to Cp and the variable node units V1 to Vn are connected through a connecting section CNT.

The decoder 11 to which the parity check matrix HM is applied may include the p number of check node units C1 to Cp and the n number of variable node units V1 to Vn. As described above, the check node units C1 to Cp may respectively correspond to the p number of rows of the parity check matrix HM. The variable node units V1 to Vn may respectively correspond to the n number of columns of the parity check matrix HM.

A line which is connected between a certain check node unit and a certain variable node unit may mean that the element of a row corresponding to the certain check node unit and a column corresponding to the certain variable node unit in the parity check matrix HM is a non-zero element. In other words, in the parity check matrix HM, each of non-zero elements may mean that a check node unit corresponding to the row thereof and a variable node unit corresponding to the column thereof are connected by a line. Although not shown, the connecting section CNT in FIG. 2 may include all the connections between the check node units C1 to Cp and the variable node units V1 to Vn.

The variable node units V1 to Vn may respectively receive the bits of the codeword. The variable node units V1 to Vn and the check node units C1 to Cp coupled by the lines may execute a message passing process. The message passing process may include an operation that the respective check node units C1 to Cp update bits inputted to the variable nodes coupled thereto and probability information, for example, log likelihood ratios corresponding to the bits. Each of the check node units C1 to Cp may update the bits of the variable node units V1 to Vn such that the binary sum of the bits of the variable node units V1 to Vn connected with it becomes 0.

When all of the variable node units V1 to Vn and all of the check node units C1 to Cp operate, the decoder 11 may perform a decoding operation with a default performance. When the variable node units V1 to Vn and some of the check node units C1 to Cp operate (that is, some of the check node units C1 to Cp are turned off), the decoder 11 may perform a decoding operation with a lower performance than the default performance. In this case, if an error correction operation succeeds even though the decoder 11 performs a decoding operation with a lower performance than the default performance, a power consumption may be reduced by turning off some of the check node units C1 to Cp.

Figure 3:
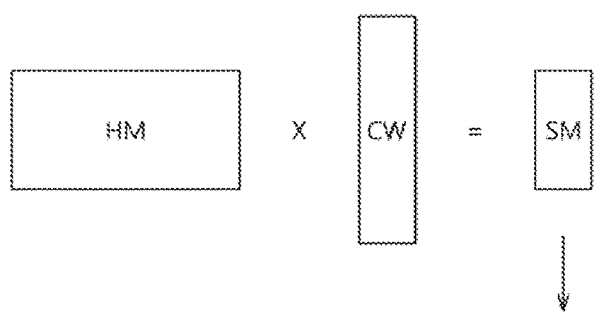
FIG. 3 is a diagram describing a method for the syndrome check circuit shown FIG. 1 to calculate a reference value in accordance with an embodiment.

FIG. 3 is a diagram describing a method for the syndrome check circuit 12 shown in FIG. 1 to calculate a reference value in accordance with an embodiment.

Referring to FIG. 3, the syndrome check circuit 12 may calculate a syndrome matrix SM by multiplying a parity check matrix HM and a column matrix CW of a codeword, and may determine the number of non-zero elements in the syndrome matrix SM, as a reference value.

Since the codeword is generated based on the parity check matrix HM, the syndrome matrix SM may include only 0s when an error does not exist in the codeword. The more errors are in the codeword, the more the syndrome matrix SM may include non-zero elements. Therefore, the reference value may be calculated as 0 when an error does not exist in the codeword, and may be substantially proportional to the error rate of the codeword.

Meanwhile, as described above, the syndrome check circuit 12 may calculate a reference value for the result of a decoding operation, each time the decoder 11 ends the decoding operation. Namely, the syndrome check circuit 12 may calculate the syndrome matrix SM by multiplying the parity check matrix HM and the result of the decoding operation, and may determine the number of non-zero elements in the syndrome matrix SM, as the reference value. The result of the decoding operation may be a codeword which is updated/corrected in variable node units after calculations are performed according to a message passing process. Even in this case, the reference value may be calculated as 0 when an error does not exist in the result of the decoding operation, and may be substantially proportional to the error rate of the result of the decoding operation.

Figure 4B:
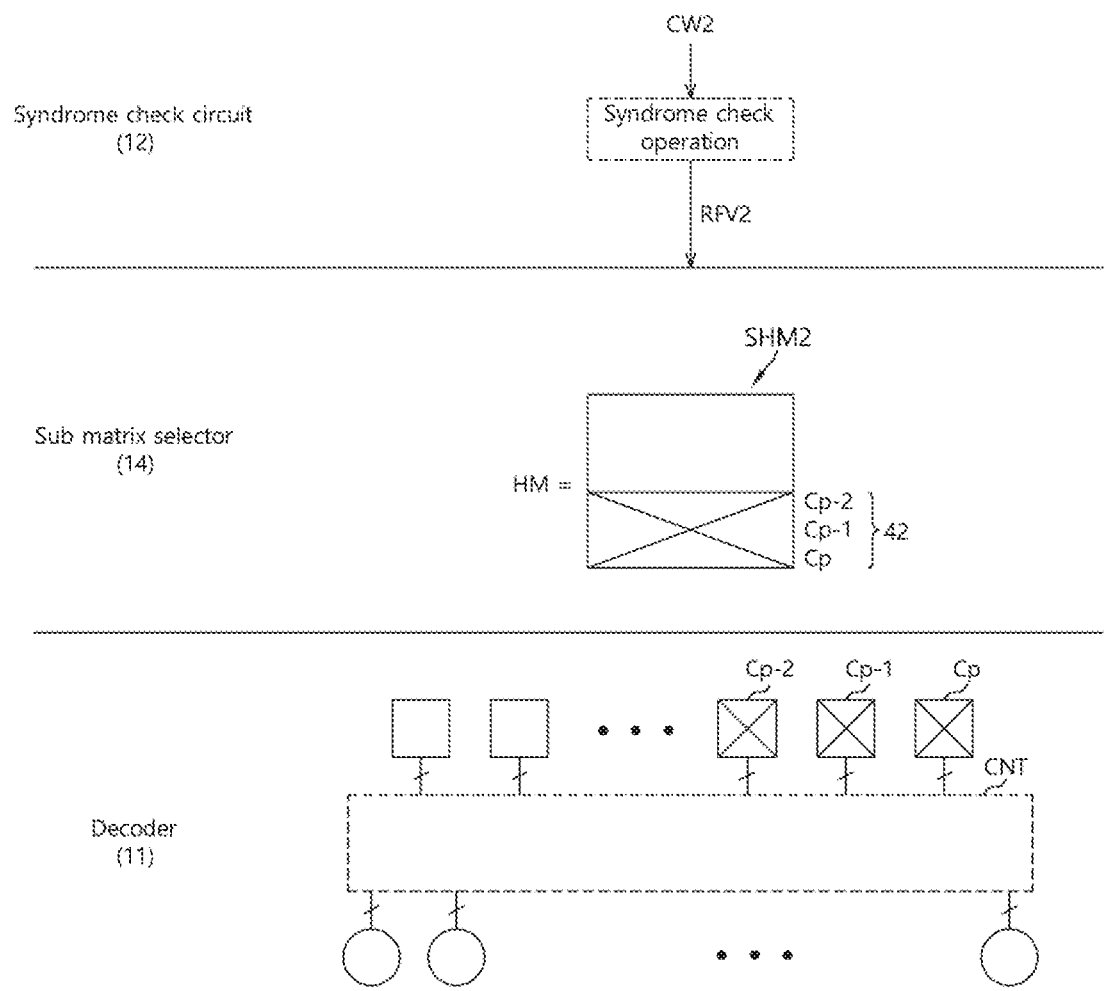

FIGS. 4A and 4B are diagrams describing a method for controlling power supply to check node units depending on a reference value in accordance with an embodiment. FIG. 4A may be an embodiment in which a non-zero reference value RFV1 is calculated for a codeword CW1 by the syndrome check circuit 12 of FIG. 1, and FIG. 4B may be an embodiment in which a non-zero reference value RFV2 is calculated for a codeword CW2 by the syndrome check circuit 12 of FIG. 1. The reference value RFV1 may be greater than the reference value RFV2. In other words, the codeword CW1 may include more errors than the codeword CW2.

First, referring to FIG. 4A, the sub-matrix selector 14 of FIG. 1 may select a parity check sub-matrix SHM1 which is obtained when rows 41 are removed from a parity check matrix HM according to the reference value RFV1.

The power controller 15 of FIG. 1 may cut off power supply to two check node units Cp-1 and Cp among the check node units of the decoder 11 and supply power to the remaining check node units and all variable node units, based on the parity check sub-matrix SHM1. That is, the power controller 15 may turn off the check node units Cp-1 and Cp corresponding to the rows 41 removed from the parity check matrix HM, and may supply power to check node units corresponding to the rows configuring the parity check sub-matrix SHM1 and all variable node units. The turned-off check node units Cp-1 and Cp may not receive any inputs through the connecting section CNT and may not perform calculations allocated thereto.

Conversely, referring to FIG. 4B, the sub-matrix selector 14 may select a parity check sub-matrix SHM2 which is obtained when rows 42 are removed from a parity check matrix HM according to the reference value RFV2.

The power controller 15 of FIG. 1 may cut off power supply to three check node units Cp-2, Cp-1 and Cp among the check node units of the decoder 11 and supply power to the remaining check node units and all variable node units, based on the parity check sub-matrix SHM2. That is, the power controller 15 may turn off the check node units Cp-2, Cp-1 and Cp corresponding to the rows 42 removed from the parity check matrix HM, and may supply power to check node units corresponding to the rows configuring the parity check sub-matrix SHM2 and all variable node units. The turned-off check node units Cp-2, Cp-1 and Cp may not receive any input through the connecting section CNT and may not perform calculations allocated thereto.

In summary, FIGS. 4A and 4B show that the power controller 15 of FIG. 1 may turn off more check node units when the reference value is smaller. In other words, the number of check node units to be turned off when a decoding operation for a certain codeword is performed may be inversely proportional to the reference value of the corresponding codeword. When the reference value is small, that is, when an error rate is low, because an error correction operation may succeed even though the decoder 11 performs the decoding operation with a lower performance, a power consumption may be reduced by turning off check node units.

According to an embodiment, the sub-matrix selector 14 may not select a parity check sub-matrix when a reference value exceeds a threshold value. In this case, the power controller 15 may supply power to all the variable node units and all the check node units of the decoder 11. That is, when it is determined that an error rate is higher than a reference, the decoder 11 may perform a decoding operation with a default performance rather than reducing a power consumption.

While it is illustrated in FIGS. 4A and 4B that the parity check sub-matrixes SHM1 and SHM2 are generated as rows are removed starting from the last row in the parity check matrix HM, it is to be noted that the embodiment is not limited thereto and rows to be removed in the parity check matrix HM may be selected variously through a test.

It may be determined according to a reference value in advance through a test to which check node units power supply is cut off. The test may be performed, if an error rate is small, by estimating whether an error correction operation succeeds even though some decoding operations are not performed. The test may be performed, for example, by variously selecting and turning off the check nodes for each of various reference values, that is, each of various error rates and then by performing a decoding operation with the turned off check nodes. As a result of the test, a combination of check node units with which an error correction operation succeeds may be selected. A parity check sub-matrix may be determined as rows corresponding to the combination of check node units are removed from the parity check matrix. The test result may be stored in a separate storage region of the error correction circuit 10, as an information which the sub-matrix selector 14 may refer to.

In this way, the sub-matrix selector 14 may select one parity check sub-matrix depending on a reference value. According to another embodiment to be described below, the sub-matrix selector 14 may select a sub-matrix sequence which includes a plurality of parity check sub-matrixes, depending on a reference value.

Figure 5:
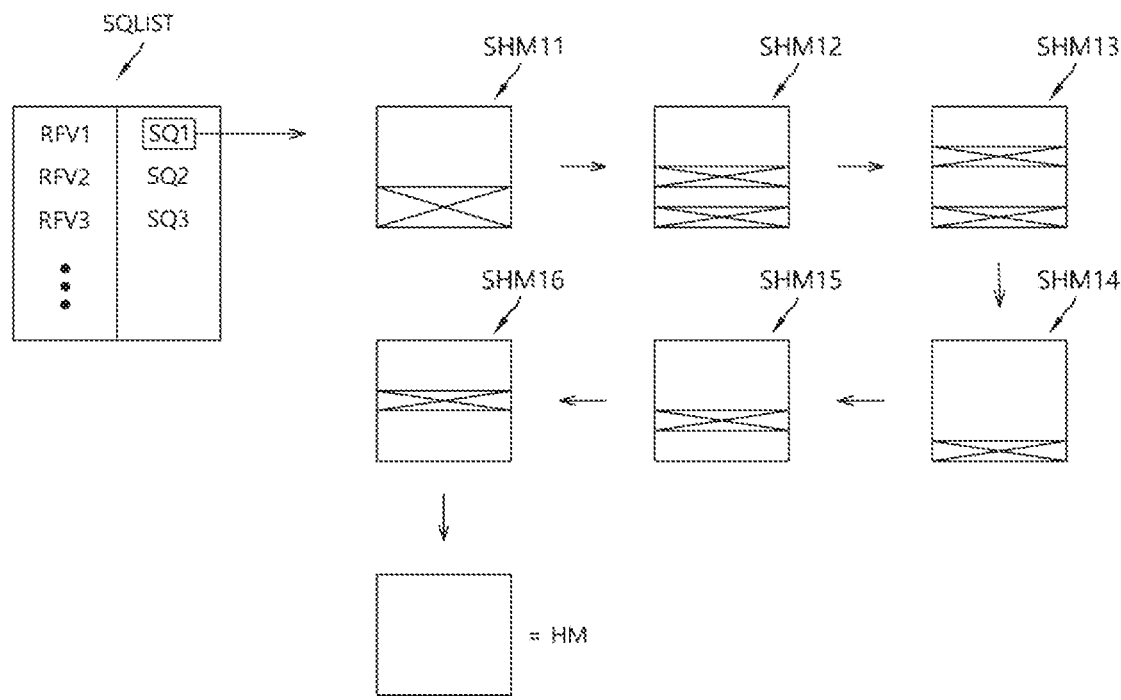
FIG. 5 is a diagram describing a method for selecting a parity check sub-matrix from a sub-matrix sequence selected depending on a reference value, in accordance with an embodiment.

FIG. 5 is a diagram describing a method for selecting a parity check sub-matrix from a sub-matrix sequence selected depending on a reference value, in accordance with an embodiment.

Referring to FIG. 5, the sub-matrix selector 14 of FIG. 1 may manage a list SQLIST of sub-matrix sequences SQ1, SQ2 and SQ3 respectively corresponding to a plurality of reference values RFV1, RFV2 and RFV3. The list SQLIST may be determined in advance by a test. If the reference value of a codeword is calculated by the syndrome check circuit 12, the sub-matrix selector 14 may select a sub-matrix sequence corresponding to the corresponding reference value in the list SQLIST.

Each sub-matrix sequence of the list SQLIST may be configured by a plurality of parity check sub-matrixes. For example, FIG. 5 illustrates parity check sub-matrixes SHM11 to SHM16 which configure the sub-matrix sequence SQL The sub-matrix sequence SQ1 may be selected when the reference value RFV1 is selected. In this situation, the sub-matrix selector 14 may sequentially select the parity check sub-matrixes SHM11 to SHM16 each time a decoding operation for a codeword is repeated.

For example, the sub-matrix selector 14 may select the parity check sub-matrix SHM11 when an initial decoding operation for a codeword is performed, and may select the parity check sub-matrix SHM12 when a decoding operation is repeated for the result of the initial decoding operation. In this case, the power controller 15 may control power supply to check node units as described above, based on the parity check sub-matrixes sequentially selected from the sub-matrix sequence SQL.

According to an embodiment, each sub-matrix sequence of the list SQLIST may include parity check sub-matrixes which include the same number of rows, for example, the parity check sub-matrixes SHM11 to SHM13. The parity check sub-matrixes SHM14 to SHM16 may also include the same number of rows. Observing the parity check sub-matrixes SHM11 to SHM13 as an example, each time a decoding operation is repeated and thereby the parity check sub-matrixes SHM11 to SHM13 are sequentially selected, the power controller 15 may operate check node units different from those in a previous decoding operation. Namely, the decoder 11 performs a decoding operation again by using different parity bits.

According to an embodiment, the parity check sub-matrixes SHM11 to SHM16 may be arranged in an ascending order of the number of rows in the sub-matrix sequence SQ1 In other words, the parity check sub-matrixes SHM11 to SHM16 may be arranged in a descending order of the number of rows removed from a parity check matrix HM. This is to perform a decoding operation with a higher performance when an error correction operation does not succeed even though decoding operations are repeated. As shown, the sub-matrix sequence SQ1 may include the complete parity check matrix HM in the last of the arrangement.

Figure 6:
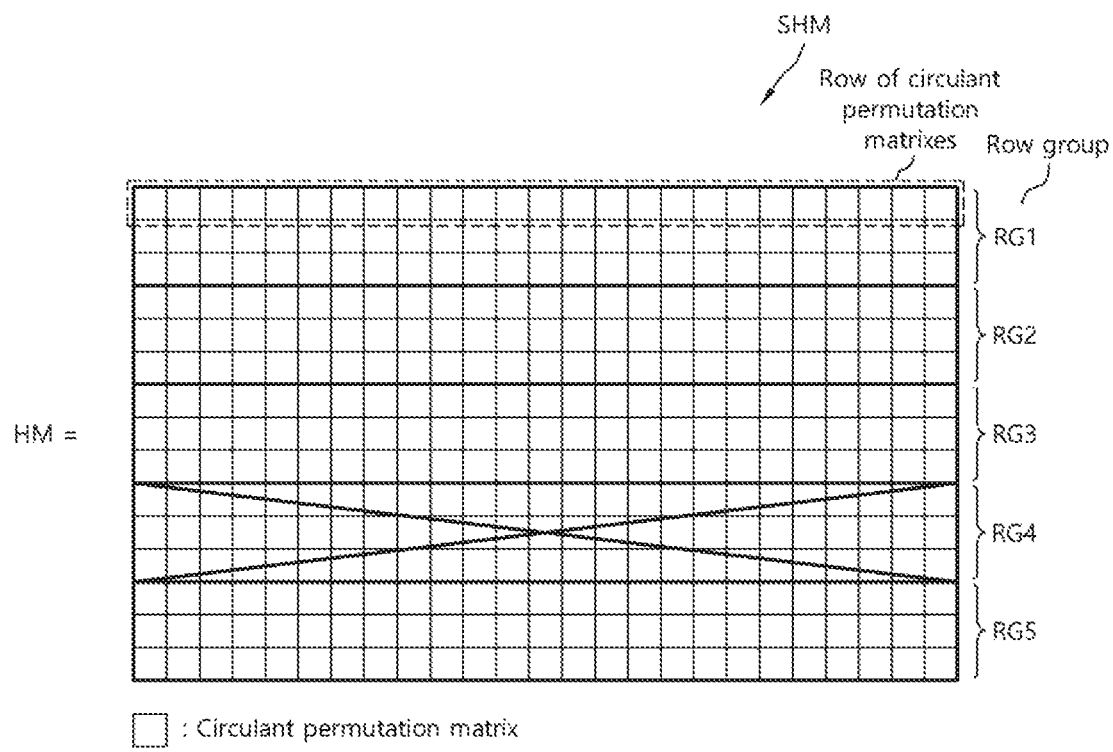
FIG. 6 is a diagram illustrating a structure of a parity check matrix including circulant permutation matrixes in accordance with an embodiment.

FIG. 6 is a diagram illustrating a structure of a parity check matrix HM including circulant permutation matrixes in accordance with an embodiment.

Referring to FIG. 6, the parity check matrix HM may be divided into row groups RG1 to RG5, and each of the row groups RG1 to RG5 may include rows of circulant permutation matrixes. In FIG. 6, it is illustrated as an example that the number of row groups RG1 to RG5 is 5 and the number of rows of circulant permutation matrixes per row group is 3. However, the present invention is not limited thereto, and the number of row groups and the number of rows of circulant permutation matrixes per row group may vary depending on design.

A parity check sub-matrix SHM may be generated as at least one row group, for example, the row group RG4, is removed from the parity check matrix HM. That is, a unit by which elements are removed from the parity check matrix HM to generate a parity check sub-matrix SHM may be a row group. Even in this case, the power controller 15 may turn off check node units corresponding to the rows included in the row group RG4.

Further, similarly as described above, the smaller a reference value is, the more the number of row groups may be removed from the parity check matrix HM.

Figure 7:
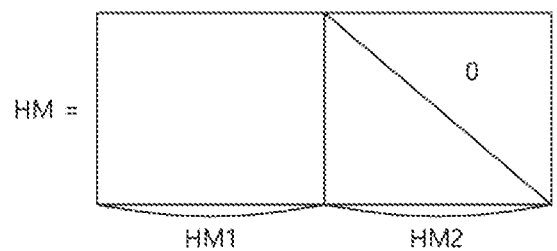
FIG. 7 is a diagram describing a method for controlling power supply to check node units and variable node units in accordance with an embodiment.
Figure 7:
Figure 7:
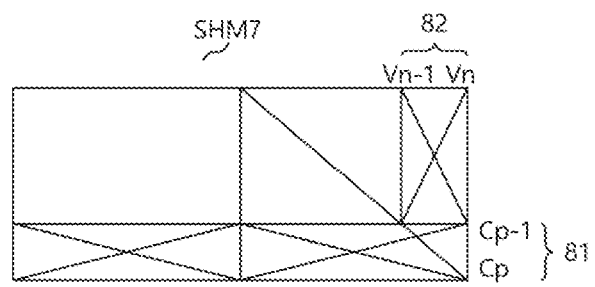
Figure 7:
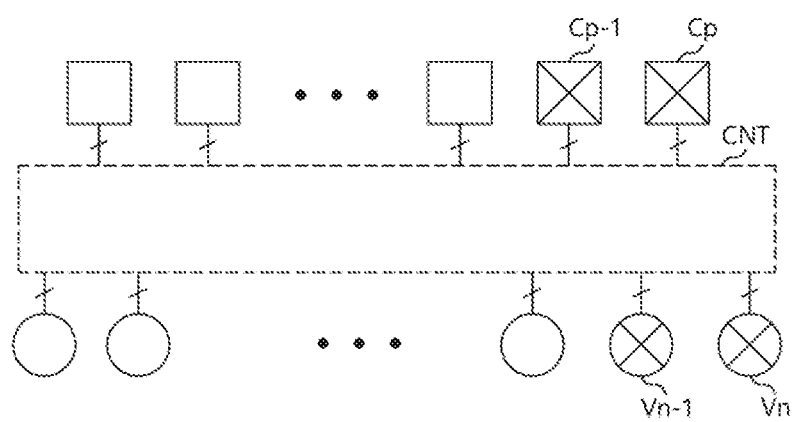

FIG. 7 is a diagram describing a method for controlling power supply to check node units and variable node units in accordance with an embodiment.

Referring to FIG. 7, according to an embodiment, a parity check matrix HM may include a parity matrix HM2 as a lower triangular matrix. In this case, the sub-matrix selector 14 may select a parity check sub-matrix SHM7 which is obtained as columns 82 are additionally removed from a sub-matrix which is obtained as rows 81 are removed from the parity check matrix HM depending on a reference value. In FIG. 7, it is illustrated as an example that two rows 81 and two columns 82 are removed. To select a parity check sub-matrix from which how many rows and columns are removed depending on a reference value may be determined in advance through a test.

The columns 82 which are additionally removed may be configured by 0s. The columns 82 which are additionally removed may be included in the parity matrix HM2.

The power controller 15 may cut off power supply to check node units Cp-1 and Cp corresponding to the removed rows 81 and variable node units Vn-1 and Vn corresponding to the removed columns 82. In other words, the power controller 15 may supply power only to check node units corresponding to the rows configuring the parity check sub-matrix SHM7 and variable node units corresponding to the columns configuring the parity check sub-matrix SHM7.

That is, the columns 82 removed from the parity check matrix HM may correspond to the variable node units Vn-1 and Vn which are not connected with any turned-on check node units, among variable node units to which parity bits are to be inputted. In other words, the columns 82 removed from the parity check matrix HM may correspond to the variable node units Vn-1 and Vn which are connected with only the turned-off check node units Cp-1 and Cp, among the variable node units to which parity bits are to be inputted. Therefore, in the present embodiment, by cutting off power supply even to the variable node units Vn-1 and Vn, which may be turned off without causing a substantial problem in an error correction operation, reduction of a power consumption may be maximized.

Figure 8:
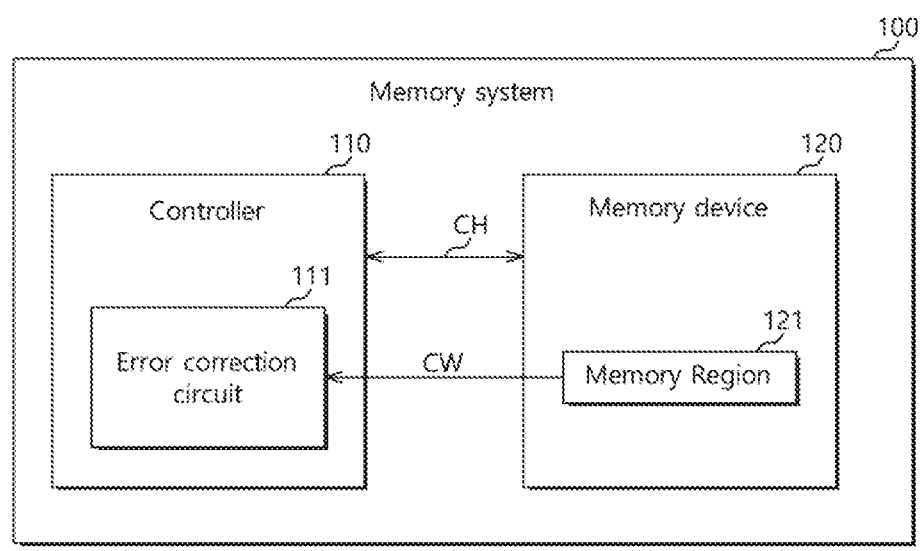
FIG. 8 is a block diagram illustrating a memory system in accordance with an embodiment.

FIG. 8 is a block diagram illustrating a memory system 100 in accordance with an embodiment.

Referring to FIG. 8, the memory system 100 may be configured to store data provided from an external host device, in response to a write request of the host device. Also, the memory system 100 may be configured to provide stored data to the host device, in response to a read request of the host device.

The memory system 100 may be configured by a Personal Computer Memory Card International Association (PCM-CIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The memory system 100 may include a controller 110 and a memory device 120.

The controller 110 may control general operations of the memory system 100. The controller 110 may access the memory device 120 to process a request of the host device. Also, the controller 110 may access the memory device 120 to perform an internal management operation or a background operation of the memory system 100 regardless of a request of the host device. An access to the memory device 120 may include a write access and a read access.

The controller 110 may include an error correction circuit 111. The error correction circuit 111 may perform an error correction operation for a codeword CW read from a memory region 121 of the memory device 120. The error correction circuit 111 may be configured and operate substantially the same as the error correction circuit 10 of FIG. 1.

The error correction circuit 111 may control power supply to the check node units and variable node units of a decoder based on a power control information. The power control information may include an information representing the error rate of the codeword CW. For example, the power control information may include the reference value of the codeword CW. In this case, similarly as described above, the lower the reference value is, the greater the number of check node units which are turned off may be.

For another example, the power control information may include a failure rate of a channel CH which couples the memory device 120 and the controller 110. In this case, the lower the failure rate of the channel CH is, the greater the number of check node units may be turned off. The failure rate of the channel CH may be obtained through various channel tests known in the art.

For still another example, the power control information may include the wear rate of the memory region 121. The wear rate of the memory region 121 may be proportional to the erase count of the memory region 121. In this case, the lower the wear rate of the memory region 121 is, the greater the number of check node units which are turned off may be.

The memory device 120 may store the data transmitted from the controller 110 and may read out stored data and transmit the read-out data to the controller 110, according to the control of the controller 110. The memory device 120 may include a nonvolatile memory device or a volatile memory device.

By way of example and not limitation, the nonvolatile memory device may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

The volatile memory device may include a DRAM (dynamic random access memory) or an SRAM (static random access memory).

Figure 9:
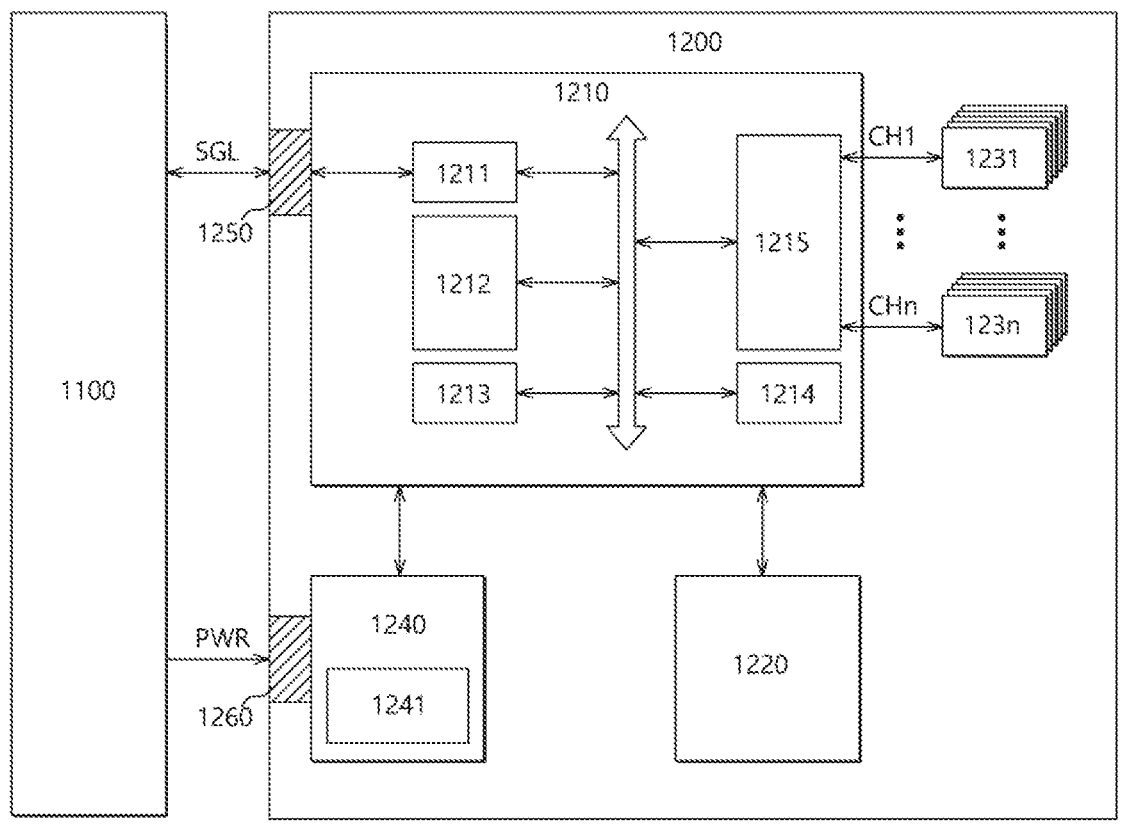
FIG. 9 is a diagram illustrating a data processing system including a solid state drive (SSD) in accordance with an embodiment.

FIG. 9 is a diagram illustrating a data processing system 1000 including a solid state drive (SSD) 1200 in accordance with an embodiment. Referring to FIG. 9, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS).

The control unit 1212 may analyze and process the signal SGL received from the host device 1100. The control unit 1212 may control operations of internal function blocks according to a firmware or a software for driving the SSD 1200. The random access memory 1213 may be used as a working memory for driving such a firmware or software.

The ECC unit 1214 may generate the parity data of data to be transmitted to at least one of the nonvolatile memory devices 1231 to 123n. The generated parity data may be stored together with the data in the nonvolatile memory devices 1231 to 123n. The ECC unit 1214 may detect an error of the data read from at least one of the nonvolatile memory devices 1231 to 123n, based on the parity data. If a detected error is within a correctable range, the ECC unit 1214 may correct the detected error.

The ECC unit 1214 may be configured in the same manner as the ECC unit 10 shown in FIG. 1.

The memory interface unit 1215 may provide control signals such as commands and addresses to at least one of the nonvolatile memory devices 1231 to 123n, according to control of the control unit 1212. Moreover, the memory interface unit 1215 may exchange data with at least one of the nonvolatile memory devices 1231 to 123n, according to control of the control unit 1212. For example, the memory interface unit 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 10:
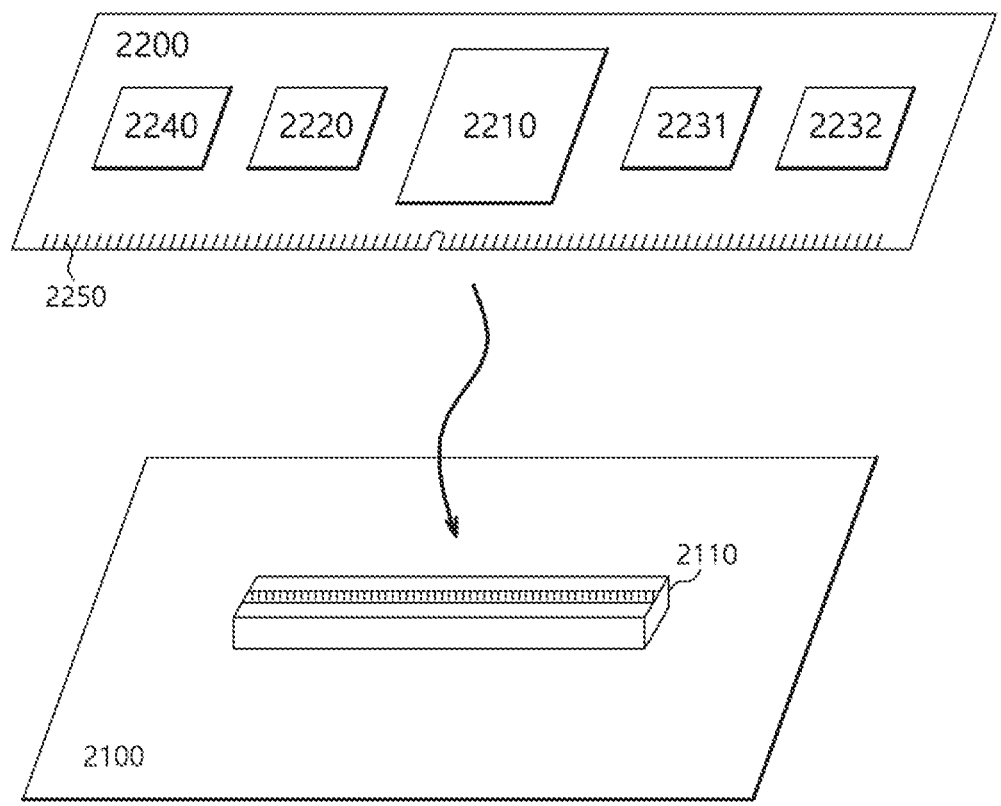
FIG. 10 is a diagram illustrating a data processing system including a memory system in accordance with an embodiment.

FIG. 10 is a diagram illustrating a data processing system 2000 including a memory system 2200 in accordance with an embodiment. Referring to FIG. 10, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 9.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 11:
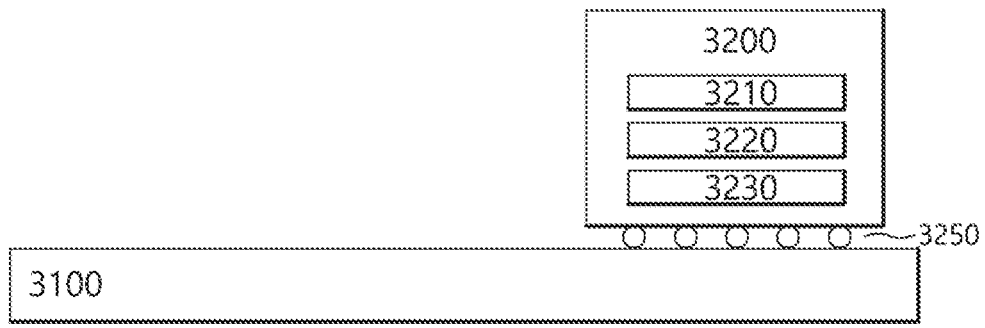
FIG. 11 is a diagram illustrating a data processing system including a memory system in accordance with an embodiment.

FIG. 11 is a diagram illustrating a data processing system 3000 including a memory system 3200 in accordance with an embodiment. Referring to FIG. 11, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 9.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 12:
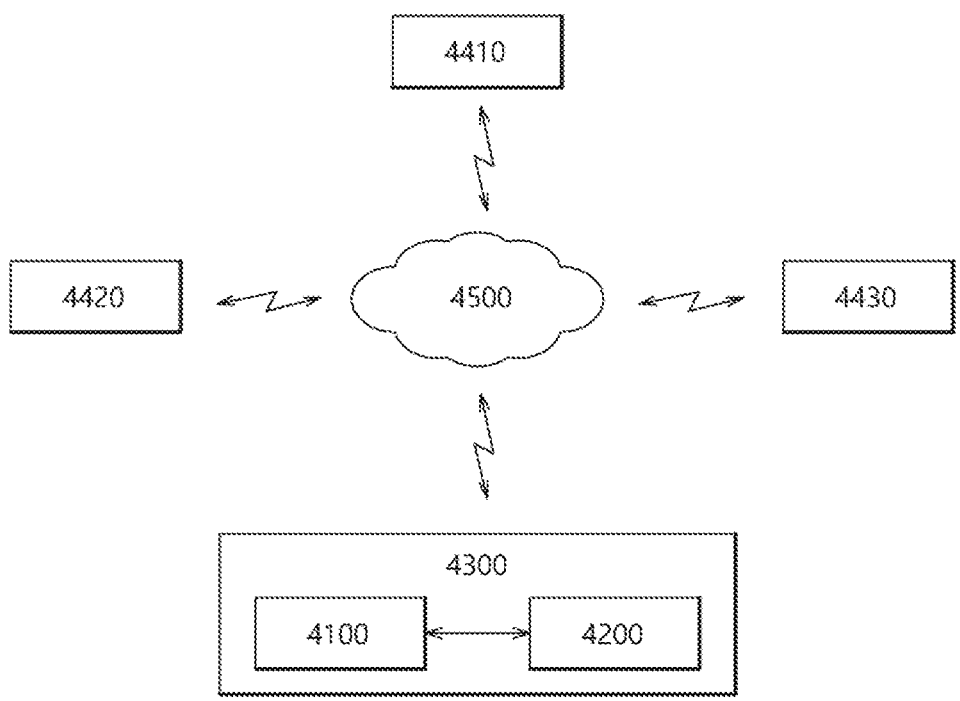
FIG. 12 is a diagram illustrating a network system including a memory system in accordance with an embodiment.

FIG. 12 is a diagram illustrating a network system 4000 including a memory system 4200 in accordance with an embodiment. Referring to FIG. 12, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 shown in FIG. 8, the memory system 1200 shown in FIG. 9, the memory system 2200 shown in FIG. 10 or the memory system 3200 shown in FIG. 11.

Figure 13:
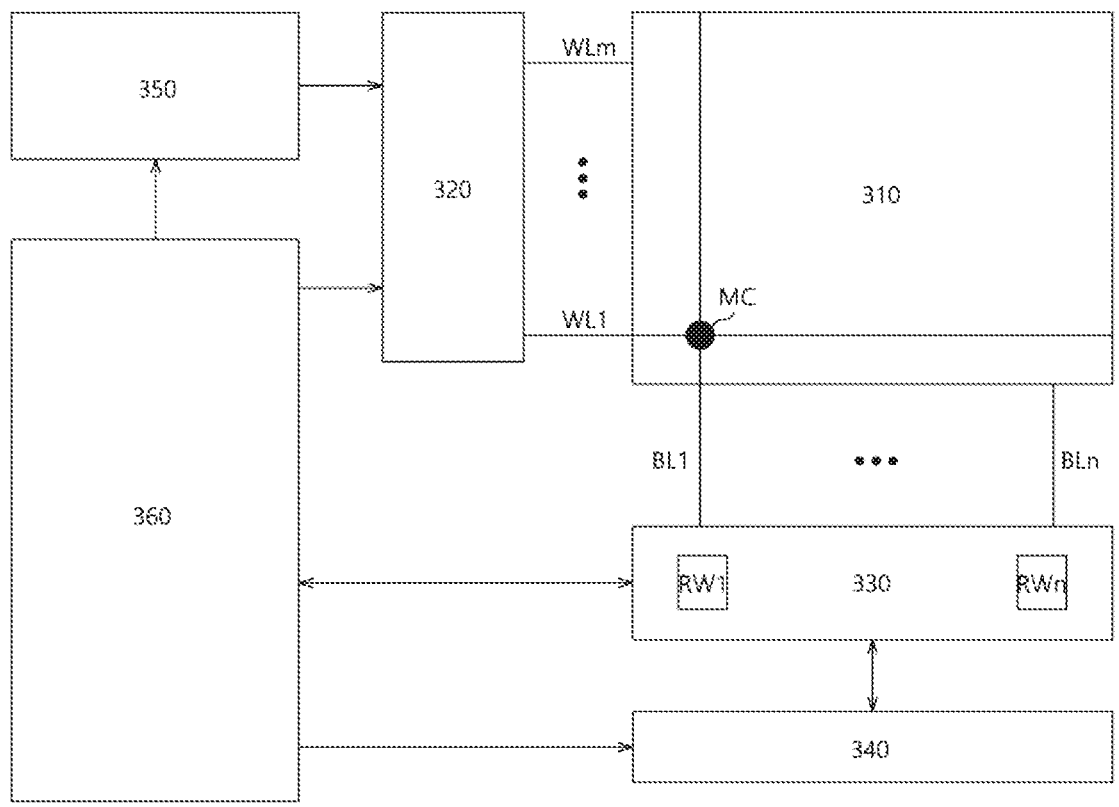
FIG. 13 is a block diagram illustrating a nonvolatile memory device included in a memory system in accordance with an embodiment.

FIG. 13 is a block diagram illustrating a nonvolatile memory device 300 included in a memory system in accordance with an embodiment. Referring to FIG. 13, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been described above, it will be understood to those skilled in the art that the embodiments described are examples only. Accordingly, the error correction circuit and the memory system including the same described herein should not be limited based on the described embodiments.

What is claimed is:

1. An error correction circuit comprising
a decoder including a plurality of check node units and variable node units corresponding to a parity check matrix of low density parity check (LDPC) scheme, and configured to generate decoded data by decoding a codeword;
a syndrome check circuit configured to calculate a reference value for the codeword based on the parity check matrix, and generate a decoder operation control signal corresponding to the reference value; and
a control circuit configured to control whether to operate each of the plurality of check node units and variable node units of the decoder in response to the decoder operation control signal,
wherein the decoder decodes the codeword based on check node units and variable node units which operate according to the control of the control circuit among the plurality of check node units and variable node units.

2. The error correction circuit according to claim 1, wherein the control circuit controls whether to operate the plurality of check node units and variable node units such that the number of check node units which operate is proportional to the reference value.

3. The error correction circuit according to claim 1, wherein the syndrome check circuit calculates a syndrome matrix by multiplying the parity check matrix and a column matrix of the codeword, and determines the reference value in correspondence to the number of non-zero elements in the syndrome matrix.

4. The error correction circuit according to claim 1, wherein when the reference value exceeds a threshold value, the control circuit controls all the plurality of variable node units and check node units to operate.

5. The error correction circuit according to claim 1, wherein the syndrome check circuit calculates a current reference value for a decoding result of the decoding of the codeword based on the parity check matrix.

6. The error correction circuit according to claim 5, wherein the decoder generates the decoded data by re-decoding the decoding result in correspondence to the current reference value.

7. The error correction circuit according to claim 6, wherein, in the re-decoding, the control circuit cuts off power supply to one or more check node units among the plurality of check node units, in correspondence to the current reference value.

8. The error correction circuit according to claim 6, wherein the syndrome check circuit generates, in correspondence to the current reference value, the decoder operation control signal which operates only some check node units among the plurality of check node units, such that the decoder uses a parity check sub-matrix that is the parity check matrix with one or more rows removed.

9. The error correction circuit according to claim 8, wherein, in order to decrease the current reference value at each time of performing re-decoding, the control circuit controls operations of the plurality of check node units such that parity check sub-matrixes are sequentially used.

10. The error correction circuit according to claim 9, wherein the control circuit controls operations of the plurality of check node units such that the numbers of rows of the parity check sub-matrixes which are sequentially used have an ascending order in the use sequence.

11. The error correction circuit according to claim 9, wherein the control circuit controls operations of the plurality of check node units such that the parity check sub-matrixes which are sequentially used include the same number of rows.

12. The error correction circuit according to claim 8, wherein the parity check matrix includes a plurality of row groups, and each of the row groups includes rows of one or more circulant permutation matrixes, and
wherein the syndrome check circuit generates the decoder operation control signal such that the parity check sub-matrix which is obtained when at least one row group is removed from the row groups of the parity check matrix is used.

13. The error correction circuit according to claim 1, wherein, when rows of the parity check matrix respectively correspond to the plurality of check node units and columns of the parity check matrix respectively correspond to the plurality of variable node units, the control circuit controls whether to operate check node units corresponding to rows and variable node units corresponding to columns configuring a parity check sub-matrix which is obtained as one or more columns are additionally removed from a sub-matrix which is obtained when one or more rows are removed from the parity check matrix depending on the reference value.

14. The error correction circuit according to claim 13, wherein the one or more columns which are additionally removed from the sub-matrix to configure the parity check sub-matrix are configured by 0s.

15. The error correction circuit according to claim 13, wherein the one or more columns which are additionally removed from the sub-matrix to configure the parity check sub-matrix are of a parity matrix between an information matrix and the parity matrix configuring the parity check matrix.

16. A memory system comprising:
a memory device including a memory region which stores a codeword, and configured to read the codeword from the memory region and output the codeword to a channel; and
an error correction circuit configured to perform an error correction operation for the codeword transmitted through the channel,
wherein the error correction circuit comprises:
a decoder including a plurality of check node units and a plurality of variable node units corresponding to a parity check matrix of low density parity check (LDPC) scheme; and
a power controller configured to cut off power supply to one or more first check node units among the check node units depending on a power control information,
wherein the decoder performs a decoding operation for the codeword by using variable node units and check node units to which power is supplied.

17. The memory system according to claim 16, wherein the error correction circuit further comprises a syndrome check circuit configured to calculate a syndrome check value for the codeword, as the power control information, based on the parity check matrix.

18. The memory system according to claim 16, wherein the error correction circuit refers to a failure rate of the channel as the power control information.

19. The memory system according to claim 16, wherein the error correction circuit refers to a wear rate of the memory region as the power control information.

20. An error correction circuit comprising:
- a storage configured to store in advance information representing one or more combinations of to-be-powered-off check node units, wherein the combinations respectively correspond to reference numbers of non-zeros;
- a decoder configured to perform a low density parity check (LDPC)-based decoding operation to a codeword iteratively a predetermined number of times until the decoding operation is successful and configured to output, when the decoding operation of a current iteration fails, information of a number of non-zeros as a result of a syndrome check at the current iteration, wherein the decoding operation is performed by powered-on check node units and variable node units among the plurality of check node units and variable node units at each iteration,
- a selector configured to select one among the combinations according to the number of non-zeros; and
- a power controller configured to cut off power supply to the selected combination for the decoding operation of a subsequent iteration,
- wherein the decoding operation is performed on a basis of a parity check matrix of a scheme of the LDPC, and
- rows and columns of the parity check matrix correspond to the check node units and variable node units.

* * * * *